United States Patent [19]
Diels et al.

[11] 4,206,527
[45] Jun. 10, 1980

[54] APPARATUS FOR DEVELOPING PRINTING PLATES COMPRISING UPPER AND LOWER ROLLS ARRANGED IN PAIRS

[75] Inventors: Wolfgang Diels, Mainz-Weisenau; Dieter Krause; Dieter Töpfer, both of Wiesbaden, all of Fed. Rep. of Germany

[73] Assignee: Hoechst Aktiengesellschaft, Fed. Rep. of Germany

[21] Appl. No.: 22,887

[22] Filed: Mar. 22, 1979

[30] Foreign Application Priority Data

Mar. 23, 1978 [DE] Fed. Rep. of Germany ....... 2812688

[51] Int. Cl.² ............................ G03D 5/06; B30B 3/04
[52] U.S. Cl. ..................................... 15/102; 100/168; 226/176
[58] Field of Search ............................. 15/77, 88, 102; 100/168; 68/256; 72/240, 243; 226/176, 177; 354/319–321

[56] References Cited

U.S. PATENT DOCUMENTS

| | | | |
|---|---|---|---|
| 3,055,242 | 9/1962 | Wilson | 100/168 |
| 3,252,311 | 5/1966 | Boyer | 68/256 X |

FOREIGN PATENT DOCUMENTS

| | | |
|---|---|---|
| 912816 | 6/1954 | Fed. Rep. of Germany . |
| 1052799 | 3/1959 | Fed. Rep. of Germany ........... 100/168 |
| 1240530 | 5/1967 | Fed. Rep. of Germany . |
| 2326122 | 12/1973 | Fed. Rep. of Germany . |
| 408441 | 4/1934 | United Kingdom . |
| 620148 | 3/1949 | United Kingdom . |

*Primary Examiner*—Edward L. Roberts
*Attorney, Agent, or Firm*—James E. Bryan

[57] ABSTRACT

This invention relates to an improvement in an apparatus for developing printing plates comprising pairs of upper and lower rolls adapted to convey said printing plates, bearing means at each end of each upper roll, and toggle lever means adapted to raise and lower said upper rolls with respect to said lower rolls, the improvement comprising a plurality of pivotal forked head means each having an upper and lower arm adapted to engage each of said bearing means, swivel shaft means supporting said forked head means and being parallel to the conveying direction of said printing plates, said upper arms of said forked head means being adapted to exert pressure on the top of said bearing means when said bearing means is in a lowered position, and said lower arms of said forked head means being adapted to support said bearing means in a raised position, means connecting one end of a toggle lever means to each forked head means, and means connecting the other end of said toggle lever means to a rotatable control shaft means which is parallel to the conveying direction of said printing plates.

11 Claims, 14 Drawing Figures

APPARATUS FOR DEVELOPING PRINTING PLATES COMPRISING UPPER AND LOWER ROLLS ARRANGED IN PAIRS

The present invention relates to an apparatus for developing printing plates, comprising upper and lower rolls arranged in pairs, particularly in a horizontal position, which serve to convey the printing plates and, if appropriate, to squeeze off any residual liquid adhering to the printing plates, with a bearing being disposed at each end of each upper roll, which bearing may be raised and lowered with respect to the lower roll and may be actuated by way of a toggle lever arrangement.

In a previously proposed apparatus of this kind (German Offenlegungsschrift No. 2,326,122) each shaft journal of an upper and a lower roll of a pair of rolls extends into a housing on each side. In this housing a bearing for the lower roll is stationarily disposed, while a bearing for the upper roll is free to pivot on a pin arranged eccentrically relative to the axis of the bearing. The side of the bearing opposite to the pin is connected with a joint. The joint, in turn, is hinged to the lower end of a lever which is adapted to swivel about a horizontal pin mounted in a bracket attached to the upper wall of the housing. An actuating handle projecting from the top of the housing is connected with the swivelling lever. The lever and the joint constitute a toggle lever arrangement which forces the upper roll against the lower roll when it is in the straight position, and which raises the upper roll from the lower roll when the actuating handle is shifted. A relief spring ensures that the upper roll is arrested in the raised position.

It is a disadvantage of the above-described apparatus that each end of each upper roll is provided with a separate actuating handle, so that a plurality of handles must be shifted to raise the upper rolls from the lower rolls, as is necessary prior to any prolonged standstill of the apparatus, for example, overnight or for the weekend. Because this is a time-consuming operation, the operator is tempted to omit it at times. If, however, the rolls are left pressed together, for example, overnight or for the weekend, deformations of their surfaces may occur, which may jeopardize a safe and gentle transport of the printing plates and prevent a complete squeezing off of liquid, particularly in horizontal processing equipment.

There is also a prior art developing apparatus for printing plates, comprising rolls which are arranged in pairs and the ends of which are supported in side plates. These side plates are divided into an upper and a lower part, and the upper part of each side plate is pivoted and equipped with the corresponding lifting elements in such a manner that the complete upper parts of the side plates or the upper part of the processing station, respectively, may be lifted together with all upper rolls.

This apparatus is comparatively expensive, particularly if the effort which must be exerted by the operator for the lifting operation is to be kept at a moderate level. In addition, the arrangement cannot be used in equipment including a number of processing stations, each of which is designed as a structural unit which may be assembled with other structural units to form the complete apparatus.

It is, therefore, an object of the present invention to provide an apparatus for developing printing plates of the above-described kind, which comprises rolls arranged in pairs and which may be actuated simply and reliably in such a manner that all upper rolls are raised in one operation. The realization of this object involves the smallest possible expenditure. The equipment also is suitable in those cases in which the developing apparatus is assembled from several units, each of which constitutes a processing station.

The invention is based on an apparatus for developing printing plates, comprising upper and lower rolls arranged in pairs, particularly in a horizontal position, which serve to convey the printing plates and, if appropriate, to squeeze off any residual liquid adhering to the printing plates, further comprising a bearing disposed at each end of each upper roll, which may be raised and lowered with respect to the lower roll and which may be actuated by way of a toggle lever arrangement.

The apparatus according to the invention has the features that a pivotal forked head each, having an upper and a lower arm, is provided for engaging the bearings of the upper rolls, with the swivel shaft of the forked head extending in parallel with the direction of transport of the printing plates. The upper arm of the forked head exerts pressure from above upon the bearing by means of the toggle lever arrangement when the bearing is in the lowered position, and the lower arm of the forked head supports the bearing when the latter is in the raised position. Further, a first end of each toggle lever arrangement is connected with the forked head and a second end of each toggle lever arrangement is connected with a rotatable control shaft which is common to all toggle lever arrangements and which is also supported in parallel with the direction of transport of the printing plates.

As mentioned above, the swivel shafts of the pivotal forked heads extend in parallel with the direction of transport of the printing plates, i.e. at right angles to the principal axes of the rolls. The toggle lever arrangements are attached to the forked heads, and each toggle lever arrangement is disposed in a plane in which the principal axis of the roll to be raised extends, and it leads to a control shaft which is also parallel to the direction of transport of the printing plates. All toggle lever arrangements disposed at one end of all rolls to be raised are connected with the same control shaft, so that the bearings at one end of these rolls may be lifted by a single rotating motion of the control shaft. The bearings at the opposite ends of the rolls are actuated in the same way. It is, therefore, necessary only to rotate the two control shafts if all upper rolls in the apparatus are to be raised. The operation for raising and lowering the rolls is thus greatly simplified, and it is impossible inadvertently to omit raising of one of the bearings at one end of the rolls.

In the apparatus according to the invention the bearings of the rolls are not rigidly fastened to the forked heads or corresponding parts; instead, an upper and a lower arm each of the forked heads engage the bearings in such a manner that the upper rolls can be easily removed from and reinserted into the apparatus when they are in the raised position. This clamping of the bearings which is automatically released when the bearings are raised, permits an easy maintenance and, if necessary, repair of the apparatus, because the lower rolls are particularly easily accessible after the removal of the upper rolls.

A further embodiment of the apparatus for developing printing plates comprises a plurality of processing stations, each processing station being designed as a structural unit which may be assembled with other structural units to form the apparatus. The apparatus has the advantageous feature that each structural unit includes a section of the control shaft which may be coupled with a section of the control shaft of the neighboring structural unit via a cross coupling piece.

In this arrangement, each unit of the apparatus which may be combined with other units, is provided with an appertaining section of the control shaft with a cross coupling piece, so that a continuous control shaft is obtained when the units are assembled.

Irrespective of the fact that the apparatus may be split up and the individual units grouped at will, this arrangement ensures a centrally controlled actuation of all bearings disposed at one end of the upper rolls.

For an easy centrally controlled actuation, a control lever is disposed at one end of the control shaft, which is rigidly connected with the control shaft.

An advantageous embodiment of the apparatus has the additional feature that a locking plate is mounted on the control shaft with a thrust piece comprising a spring-mounted ball forced against the locking plate.

This thrust piece is appropriately made in one piece with a part of the control lever, and it makes it possible for the control shaft to adopt two defined switch positions, namely a first position in which the upper rolls are pressed against the lower rolls, and a second position in which the upper rolls may be removed from the lower rolls. In the last-mentioned switch position the thrust piece contacting the locking plate also can arrest the rolls in their raised position.

Further, the apparatus has the advantageous features that the upper and the lower arm of the forked head are arranged in a vertical plane in which the axis of the appertaining roll lies, and that a guide bearing having two lateral arms is stationarily disposed in a horizontal plane in which the axis of the roll also lies, in such a manner that the lateral arms encompass the bearing which is vertically displaceable with respect thereto.

In this arrangement each bearing is, therefore, supported on at least three sides, i.e. on two sides in the direction of transport of the printing plates and (in the raised position) from below or (in the lowered position) from above. Advantageously, the arrangement is such that the rolls can be removed from and reinserted between the two lateral arms of the guide bearing, when the forked head is in the raised position.

In order to be able to remove the upper roll, the upper arm of the forked head is further advantageously dimensioned in such a manner that the bearing is cleared in the upward direction when it is in the raised position. The upper arm of the forked head is thus in contact with the bearing only when the upper roll is to be pressed against the lower roll.

Appropriately, a pressure roller is rotatably mounted on the upper arm, while the lower arm is provided with a rotatably mounted lifting roller.

By means of the pressure roller and the lifting roller the forces required to raise the upper rolls or to press the upper rolls against the lower rolls are considerably reduced. In addition, the arrangement comprising a pressure roller and a lifting roller is largely resistant to wear, so that any readjustment or exchange of parts is unnecessary over a long period of time.

In a particularly advantageous embodiment of the apparatus, the toggle lever arrangement is provided with a toggle lever which may be rigidly connected with the control shaft and which is linked with a first threaded rod via a toggle joint bearing. The first threaded rod is, via a turnbuckle nut, linked with a second threaded rod at the end of which the forked head is pivotal. The first threaded rod may be screwed into the turnbuckle nut by means of a right-hand thread, and the second threaded rod may be screwed into the turnbuckle nut by means of a left-hand thread.

In this arrangement, the pressure exerted by the upper rolls upon the lower rolls and the height by which the upper rolls are raised with respect to the lower rolls may be regulated by adjusting the turnbuckle nut.

Further, the apparatus has the desirable feature that a support ring is provided at each bearing, which encloses a ball bearing mounted on the journal of the roll.

By means of this support ring, the forces exerted by the arms of the forked head and by the lateral arms of the guide bearing may be uniformly distributed over the outer race of the ball bearing. In addition, the support ring makes it possible to adjust ball bearing diameters to the dimensions of the forked head and the guide bearing.

The invention will be further illustrated by reference to the accompanying drawings, in which.

Figure 1:
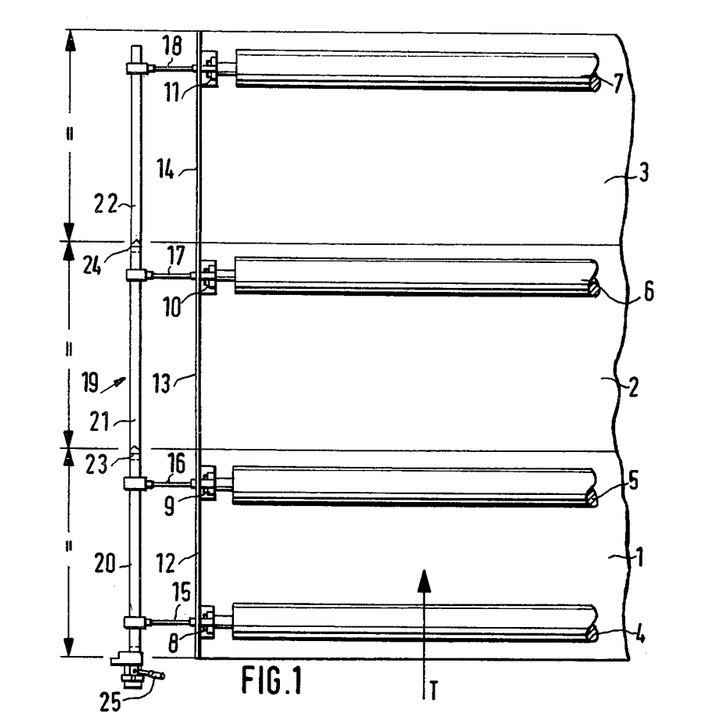
FIG. 1 is a plan view of a substantial part of the apparatus for developing printing plates, made up of several structural units.

In FIG. 1, the reference numerals 1, 2, and 3 denote three structural units which represent a processing station each. Viewed in the direction of transport T these are: a developing station, a washing station, and a station for applying a protective coating to the developed and washed printing plate. FIG. 1 does not depict the actual processing equipment which may comprise spray tubes, doctor blades and brush rollers, but it shows the pairs of rolls which serve to convey the printing plates through the apparatus and, if appropriate, to squeeze off any residual liquid from the printing plates. Of these pairs of rolls, the upper rolls 4 and 5 in the first structural unit and the upper rolls 6 and 7 in structural units 2 and 3 are shown. The rolls 4 to 7 are supported on their left-hand sides in the bearings 8 to 11, which are attached to the side plates 12, 13, and 14 of the structural units 1, 2, and 3 in a manner described below.

Each of the bearings 8 to 11 is, via a toggle lever arrangement 15 to 18, coupled with a control shaft 19 which is supported alongside the apparatus parallel to the direction of transport T. The control shaft is assembled from three sections 20, 21, and 22, which are part of a structural unit each and which are rigidly connected with one another by means of the cross coupling pieces 23 and 24. The control shaft is actuated by a control lever 25 provided at its forward end.

FIG. 1 shows the left side only of the apparatus for developing printing plates; the adjoining right-hand side, which is not shown, is identically arranged.

Figure 2:
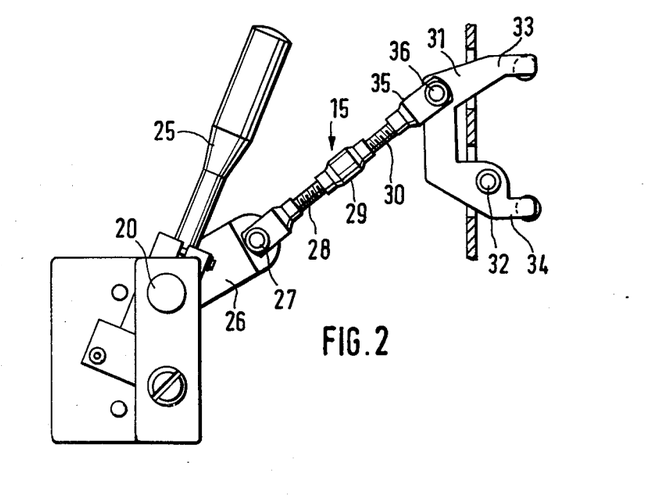
FIG. 2 is a front view of a toggle lever arrangement which is connected, with a control shaft and is in the lowered position.
Figures 3, 4:
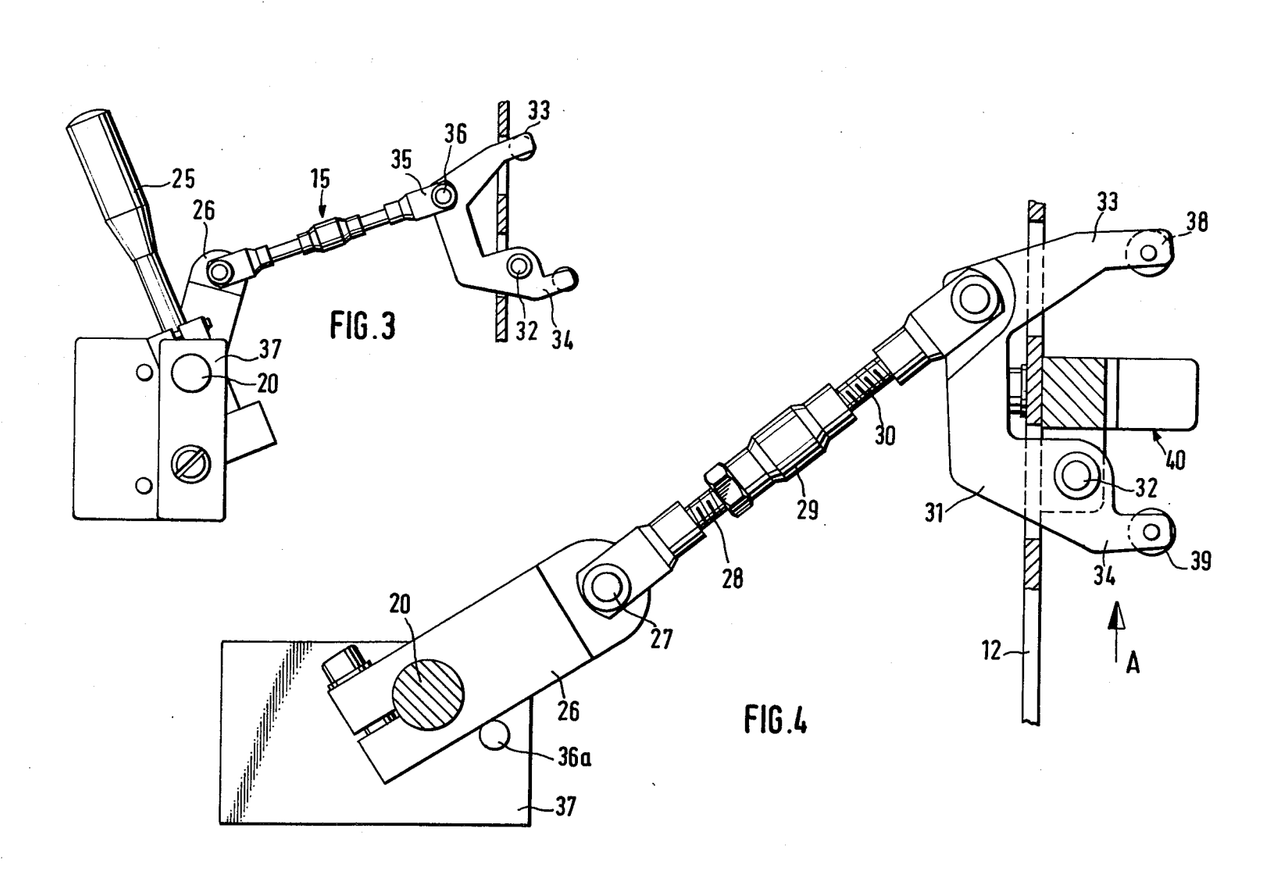
FIG. 3 shows the arrangement of FIG. 2, however, in the raised position.
FIG. 4 is a front view of the lowered toggle lever arrangement together with the guide bearing, which is enlarged as compared with the representation in FIG. 2.

FIGS. 2 and 3 show the toggle lever arrangement 15 in connection with section 20 of the control shaft and with the control lever 25 in two switch positions:

The control lever 25 points to the right when it is in the switch position for lowering the upper roll upon the lower roll, as shown in FIG. 2. Then, a toggle lever 26 which is rigidly connected with the control shaft, is also shifted to the right. Via a toggle joint bearing 27, a first threaded rod 28, a turnbuckle nut 29, and a second threaded rod 30 the toggle lever is connected with a forked head 31 pivots about a swivel shaft 32, extending in parallel with the direction of transport of the printing plates.

In FIG. 2, the toggle lever arrangement 15 is in a position in which the bearing, which is not shown and which is encompassed by an upper arm 33 and a lower arm 34 of the forked head is pressed downwardly by the upper arm 33, in such a manner that the upper roll is forced against the appertaining lower roll at the desired contact pressure. In the position according to FIG. 3, on the other hand, the bearing of the upper roll (not shown) is raised by the lower arm 34 of the forked head, so that the upper roll is at a distance from the lower roll. This position is obtained by shifting the control lever 25 to the left, whereby the toggle lever 26 is also shifted to the left. As a result, the forked head is rotated about the swivel shaft 32 in a counterclockwise direction, so that the upper arm 33 is retracted to such an extent that the bearing (not shown) is free to be removed upwardly together with the upper roll.

In connection with FIGS. 2 to 4 it is shown that the toggle lever arrangement 15 comprises the toggle lever 26, the toggle joint bearing 27, the first threaded rod 28, the turnbuckle nut 29, and the second threaded rod 30. The first end 35 of the toggle lever arrangement is connected with a bearing 36 of the forked head, whereas the toggle lever 26 is in contact with a stop pin 36a which is inserted in a support 37 of the control shaft.

In FIG. 4, the toggle lever 26 which is clamped to the section 20 of the control shaft is shifted to the right, and, as a consequence, the forked head has adopted the position in which the upper roll is pressed against the lower roll.

In addition, FIG. 4 shows that a pressure roller 38 is mounted on the upper arm 33 of the forked head, while the lower arm 34 carries a lifting roller 39. It also can be seen from FIG. 4 how a guide bearing 40 is attached to the side plate 12, so that the bearing the upper roll (not shown) is encompassed by two lateral arms 41 and 42 of the guide bearing, see also FIG. 9. The swivel shaft 32 is inserted in a lower part of the guide bearing.

Figures 5, 6:
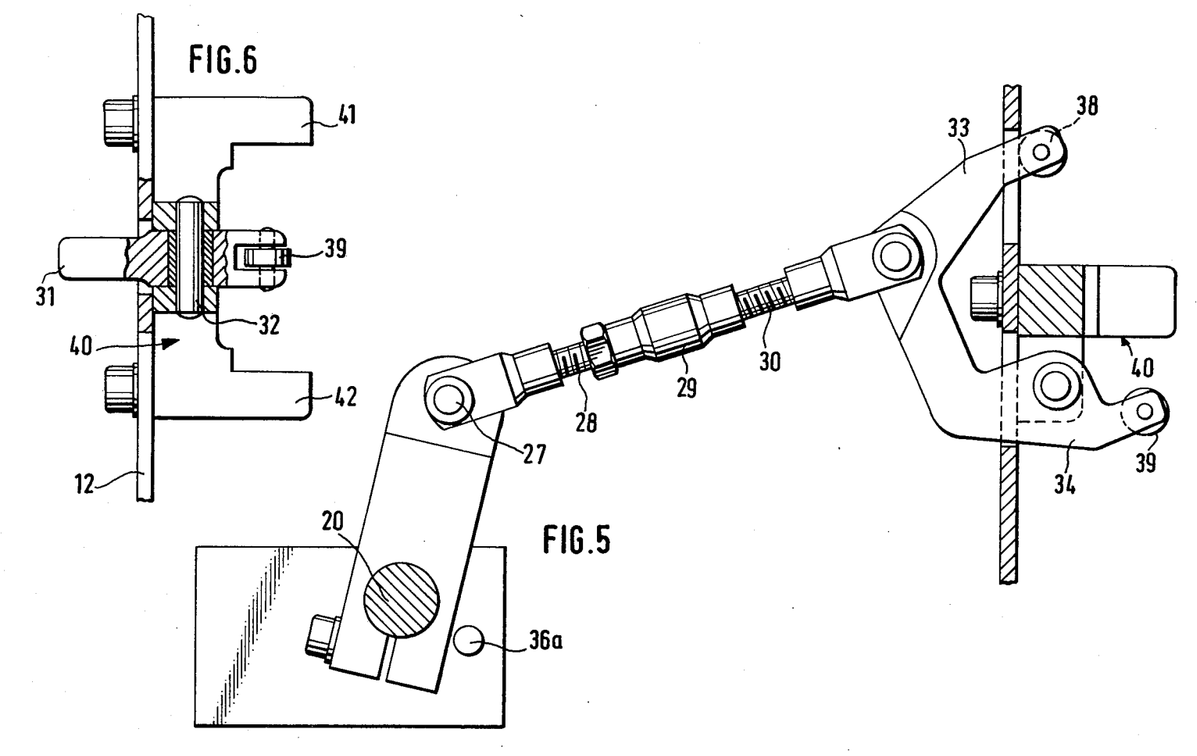
FIG. 5 shows the toggle lever arrangement according to FIG. 4, however, in the raised position.
FIG. 6 shows a detail of FIG. 4 viewed from below in the direction of the arrow A in FIG. 4.

In FIG. 5, the toggle lever arrangement is in the switch position in which the rolls are released, i.e. the bearing of the upper roll (not shown) is raised by the lifting roller 39. The upper bearing is then guided between the lateral arms 41 and 42 of the guide bearing, see also FIG. 10.

By adjusting the turnbuckle nut 29 with respect to the first and second threaded rods 28 and 30, the contact pressure of the rolls in the lowered position of the upper arm 33, or the height by which the upper roll is raised by the lower arm 34, respectively, may be regulated.

FIG. 6 depicting the guide bearing 40 with its lateral arms 41 and 42 viewed from below, shows particularly clearly, in a partly broken away representation, how the forked head 31 is supported on the swivel shaft 32. The forked head and the guide bearing thus form a unit which may be fastened to the side plate 12.

Figure 7:
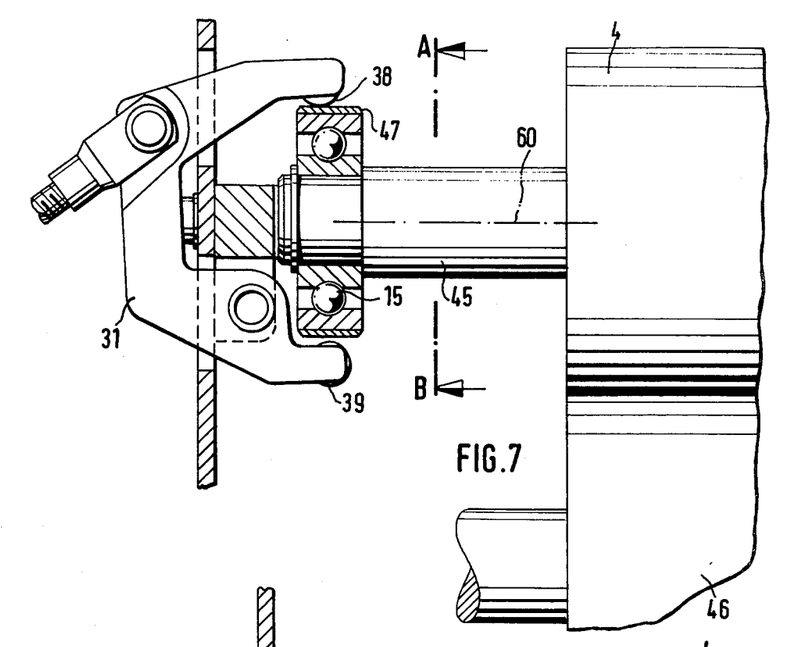
FIG. 7 is a detail of FIG. 4, namely the lowered forked head which presses an upper roll against a lower roll via a bearing.
Figure 9:
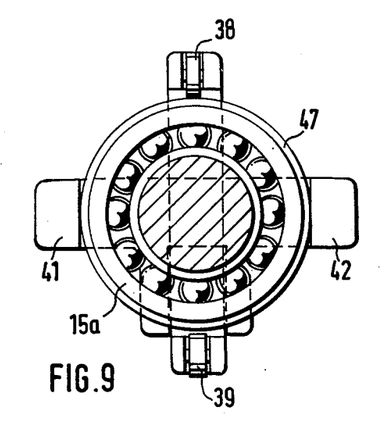
FIG. 9 is a cross-sectional view along the line AB in FIG. 7.

FIG. 7 shows the forked head 31 which presses down the bearing mounted on the shaft journal 45, so that the upper roll 4 is forced against the appertaining lower roll 46. This switch position is represented in FIG. 9 by a cross-sectional view along the line AB in FIG. 7. As can also be seen from FIGS. 7 and 9 the actual bearing 15a is enclosed in a support ring 47. The upper pressure roller 38 and the lower lifting roller 39 thus can roll over this support ring.

Figure 8:
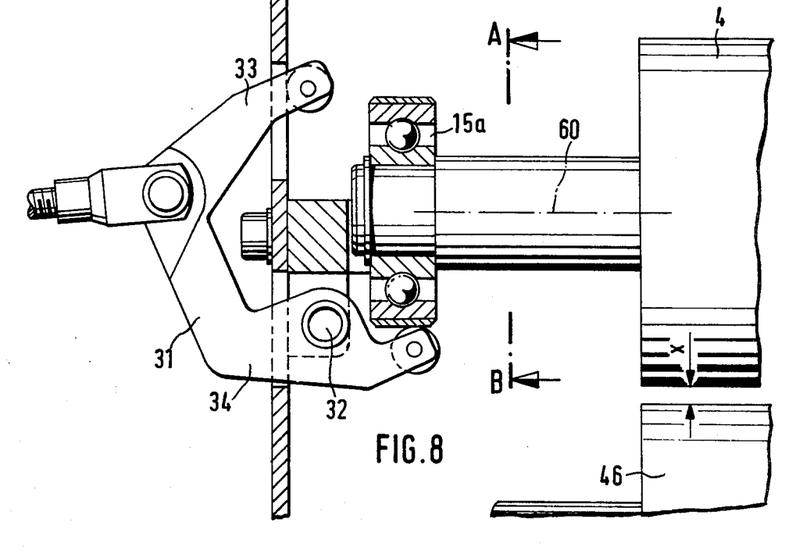
FIG. 8 shows the arrangement according to FIG. 7, in which the bearing and the appertaining upper roll are in the raised position.
Figure 10:
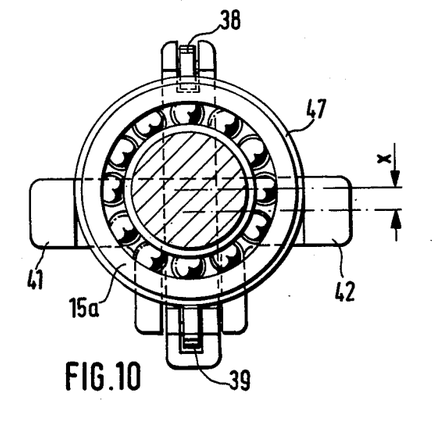
FIG. 10 is a cross-sectional view along the line AB in FIG. 8.

In FIG. 8, the position of the forked head 31 is such that the rolls 4 and 46 of the pair of rolls are released, with the upper roll 4 being lifted by a height x. The parts of the apparatus which are raised in this switch position are shown in FIG. 10 by a cross-sectional view along the line AB.

As may further be seen from FIG. 8 the upper arm 33 is, in the raised position of the upper roll 4, retracted to such an extent that the roll 4 and its bearing 15a can be freely removed in the upward direction.

Figure 11:
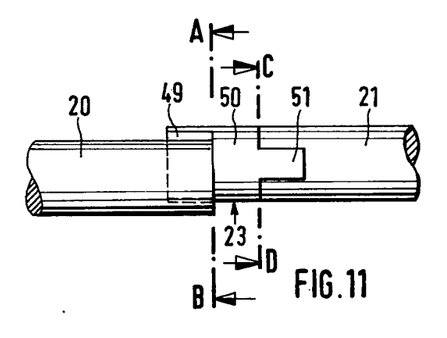
FIG. 11 shows a cross coupling piece which serves to couple two sections of the control shaft.
Figure 12:
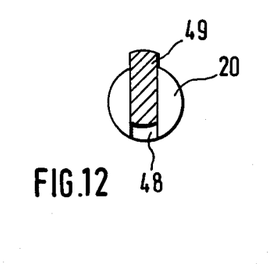
FIG. 12 is a cross-sectional view of the cross coupling piece along the line AB in FIG. 11.
Figure 13:
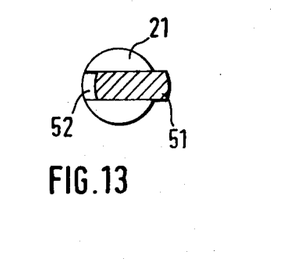
FIG. 13 is a cross-sectional view of the cross coupling piece along the line CD in FIG. 11.

FIGS. 11 to 13 are detailed representations of a cross coupling piece 23 which serves to couple the sections 20 and 21 of the control shaft. As can be seen, a slot 48 is provided in the end face of the section 20 of the control shaft, into which a sliding finger 49 of an intermediate piece 50 extends. The intermediate piece is introduced in a slot 52 in section 21 of the control shaft by means of a finger 51.

In this manner, the sections of the control shaft are positively coupled in the direction of rotation, with the intermediate piece 50 compensating for any misalignment of the sections.

Figure 14:
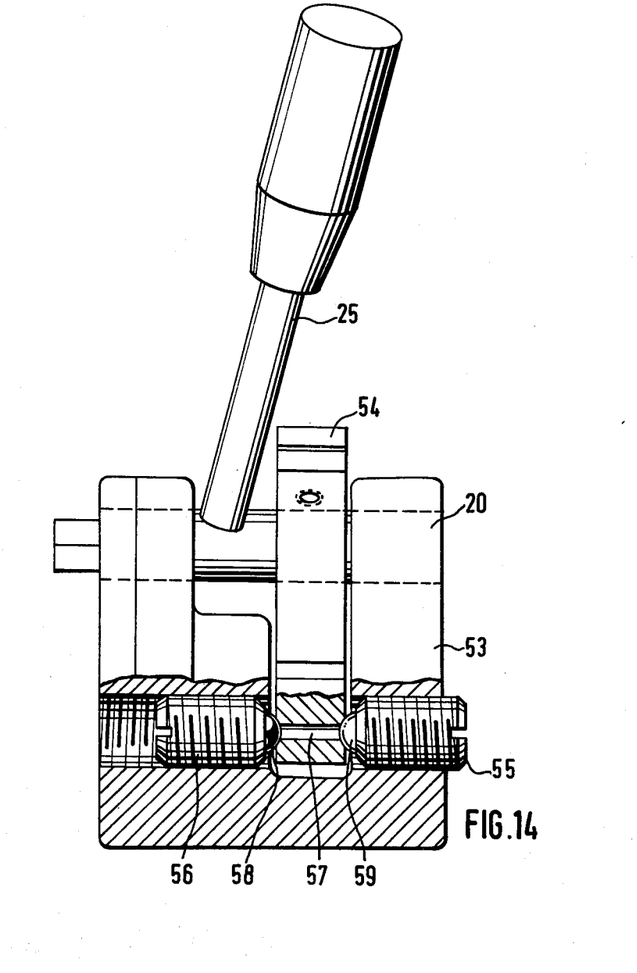
FIG. 14 shows a control lever together with a locking plate and a support, in a lateral view which is partly sectioned.

FIG. 14 shows how the control lever 25 is embedded in the section 20 of the control shaft which, in turn, is passed through a support 53 for the control lever. A locking plate 54 is also rigidly connected with the section 20 and interacts with the two thrust pieces 55 and 56. The thrust pieces serve to lock the control shaft in position, when it is rotated to raise the upper rolls. Each of the thrust pieces comprises a ball 58 and 59 which is pressed into a bore 57 in the locking plate by a pressure spring located in each thrust piece.

It will be obvious to those skilled in the art that many modifications may be made within the scope of the present invention without departing from the spirit thereof, and the invention includes all such modifications.

What is claimed is:

1. In an apparatus for developing printing plates comprising pairs of upper and lower rolls adapted to convey said printing plates, bearing means at each end of each upper roll, and toggle lever means adapted to raise and lower said upper rolls with respect to said lower rolls, the improvement comprising a plurality of pivotal forked head means each having an upper and lower arm adapted to engage each of said bearing means, swivel shaft means supporting said forked head means and being parallel to the conveying direction of said printing plates, said upper arms of said forked head means being adapted to exert pressure on the top of said bearing means when said bearing means is in a lowered position, and said lower arms of said forked head means being adapted to support said bearing means in a raised position, means connecting one end of a toggle lever means to each forked head means, and means connecting the other end of the said toggle lever means to a rotatable control shaft means which is parallel to the conveying direction of said printing plates.

2. An apparatus according to claim 1 including a plurality of processing stations, each designed as a structural unit and adapted to be assembled with additional structural units to form the apparatus, each of said structural units including a section of said control shaft means, and coupling means adapted to connect said sections together.

3. An apparatus according to claim 1 including control lever means connected to one end of said control shaft means.

4. An apparatus according to claim 1 including locking plate means connected to said control shaft means, and thrust elements including spring-mounted balls adapted to press against said locking plate means.

5. An apparatus according to claim 1 in which said upper and lower arms of said forked head means are in a vertical plane together with the axis of said bearing means, and including guide bearing means on each of said forked head means, said guide bearing means having two lateral arms mounted thereon in the same plane with the axis of said bearing means when said bearing means is in the lowered position, and said bearing means being vertically displaceable with respect to said lateral arms.

6. An apparatus according to claim 1 in which said upper arms of said pivotal forked head means are dimensioned such that they clear said bearing means when the latter are in the raised position.

7. An apparatus according to claim 1 including roller means mounted on each of said upper and lower arms.

8. An apparatus according to claim 1 in which said toggle lever means includes a toggle lever connected to said rotatable control shaft means, a toggle joint bearing connecting said toggle lever with a first threaded rod, a turnbuckle nut connecting said first threaded rod with a second threaded rod, said first threaded rod having a right-hand thread and said second threaded rod having a left-hand thread, and said pivotal forked head means being mounted at the end of said second threaded rod.

9. An apparatus according to claim 1 including support ring means enclosing ball bearing means on each of said bearing means.

10. An apparatus according to claim 1 in which said pairs of upper and lower rolls are in a horizontal position.

11. An apparatus according to claim 1 in which said pairs of upper and lower rolls squeeze off any residual liquid adhering to the printing plates.

* * * * *